TRANSISTOR PULSE TRANSMISSION CIRCUITS

INVENTOR
J. H. FELKER
BY R. B. Ardis
ATTORNEY

May 5, 1959 J. H. FELKER 2,885,572

TRANSISTOR PULSE TRANSMISSION CIRCUITS

Filed Oct. 20, 1955 3 Sheets-Sheet 2

INVENTOR
J. H. FELKER
BY R. B. Ardis
ATTORNEY

May 5, 1959 J. H. FELKER 2,885,572

TRANSISTOR PULSE TRANSMISSION CIRCUITS

Filed Oct. 20, 1955 3 Sheets-Sheet 3

INVENTOR
J. H. FELKER
BY R. B. Ardis
ATTORNEY

United States Patent Office 2,885,572
Patented May 5, 1959

2,885,572

TRANSISTOR PULSE TRANSMISSION CIRCUITS

Jean H. Felker, Livingston, N.J., assignor to Bell Telephone Laboratories, Incorporated, New York, N.Y., a corporation of New York Application October 20, 1955, Serial No. 541,636

12 Claims. (Cl. 307—88.5)

This invention relates generally to transistor circuits for the transmission of short pulses of direct current and more particularly, although in its broader aspects not exclusively, to junction transistor circuits for use in parallel type digital computers.

In a parallel binary adder, addition in each of the digit stages may take place substantially simultaneously if there is no delay in the transmission of carry pulses from one stage to the next. When such a delay does exist, the operating speed of the adder is determined, at least to a first approximation, by the time required for a carry pulse to be transmitted all the way through the chain of digit stages. It is, therefore, desirable to reduce the time delay involved in the transmission of a carry pulse through each stage to substantially zero if the maximum operating speed possibilities of a parallel binary adder are to be realized.

In the past, the carry chain of a parallel binary adder has generally been composed of a series of gate circuits arranged so that each stage triggers the next. This practice has presented no insuperable problems with vacuum tubes employed as the active gating elements, thanks largely to the extremely short turn-on times of such devices. When it is attempted to use transistors, however, particularly those of the junction type, it is found that their relatively longer turn-on times tend to introduce a substantial delay in the transmission of a carry pulse from one stage to the next and to slow down the operation of the adder to a serious extent.

An object of the invention, therefore, is to eliminate as nearly as possible the time delay involved in transmitting a pulse of direct current through a junction transistor gate circuit.

A closely related object is to transmit a short pulse of direct current through a long chain of transistor gate circuits with substantially no cumulative time delay.

An additional object is to permit junction transistors to be used as the active gating elements in the carry chain of a parallel binary adder without slowing down the speed of operation of the adder.

In its principal form, the present invention is a junction transistor carry chain which introduces substantially no cumulative time delay in its operation. In accordance with the invention, a plurality of junction transistors are arranged with their internal collector-emitter paths connected in tandem to form a series chain, a direct-current control pulse is applied to each transistor to bias the emitter junction in the direction providing low collector-emitter impedance, and a direct-current carry pulse, synchronized with the control pulse so that the carry pulse overlaps at least part of the control pulse in time and has its leading edge trailing the leading edge of the control pulse by at least the turn-on time of the slowest transistor in the chain, is applied to the collector electrode of the first transistor in the chain. When the carry pulse is applied to the first transistor, it finds the internal collector-emitter path in its low impedance condition and is transmitted to the next transistor, and so on throughout the length of the chain with substantially no time delay.

An important feature of the invention is the careful synchronization between the control pulse applied to each transistor to bias the emitter junction in the desired direction and the carry pulse applied to the transistor collector electrode. In the past, as disclosed, for example, in copending application Serial No. 410,924, filed Febuary 17, 1954, by P. A. Reiling, junction transistor switches of the type featured by the present invention have been used chiefly to sample portions of an alternating or direct voltage applied across the collector and emitter electrodes of the transistor. Sampling pulses applied between the emitter and base electrodes of the transistor have been used to control the condition of the switch. Since the alternating or direct voltage being sampled is applied continuously, no problem arises with respect to delay imposed in the collector-emitter path while switching takes place. When it is attempted to control the transmission of short pulses of direct current through the internal collector-emitter path of the transistor by means of control pulses applied between the emitter and base electrodes, however, the same delay found in junction transistor gate circuits tends to be encountered. In accordance with a principal feature of the present invention, such delay is avoided by the careful synchronization between the control pulse at the transistor emitter-base circuit and the carry pulse at the collector. By the application of the control pulse in advance of the carry pulse by substantially the turn-on time of the slowest transistor in the chain, all transistors are already switched to their low impedance condition by the time the carry pulse is applied, and substantially instantaneous transmission through the carry chain is achieved.

From a somewhat different point of view, the present invention may be considered to take the form of a logical And circuit, which produces on output pulse when, and only when, all of its plurality of input terminals are energized. In this form, the invention features a plurality of junction transistors arranged with their internal collector-emitter paths forming a series chain, a first source of regularly spaced pulses of direct current and means to apply them to the collector of the first stage, and a second source of pulses of direct current synchronized with the first source and means to apply them selectively and simultaneously to each of the transistors to bias the emitter junction in the direction providing low collector-emitter impedance. The emitter electrode of the last stage in the chain forms the output terminal and the emitter-base paths of the respective stages the input circuits. The pulses from the second source are timed to lead those from the first source in the manner featured by the invention and, when all input circuits are energized, the chain passes the appropriate pulse all the way from the first source to the emitter electrode of the final stage, where it forms the output pulse of the And circuit.

A more complete understanding of the invention in its various aspects may be obtained from a study of the following detailed description of several specific embodiments. In the drawings.

Figure 1:
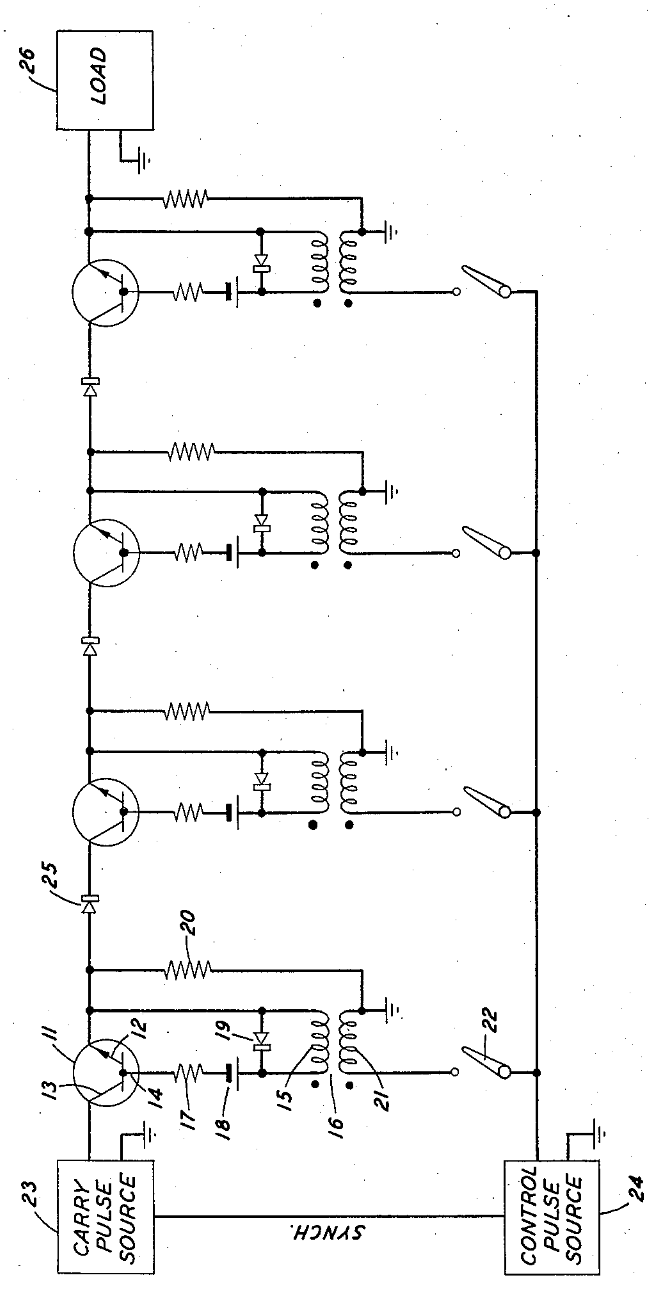
Fig. 1 illustrates an embodiment of the invention which, depending upon the point of view, is either a fast carry system for a parallel binary adder or a logical And circuit.

From one point of view, the embodiment of the invention shown in Fig. 1 may be regarded as a fast carry chain suitable for use in a parallel binary adder. Four stages are shown in the chain, by way of example, although either a larger or a smaller number could be used, depending upon the number of digit stages included in the adder or other computer circuit with which it is associated.

In the illustrated example, the first stage includes a junction transistor 11 of the n-p-n type having an emitter electrode 12, a collector electrode 13, and a base electrode 14. A secondary winding 15 of a pulse transformer 16 is connected in series with a resistor 17 and a source 18 of direct biasing potential between emitter electrode 12 and base electrode 14, with source 18 poled to bias the emitter junction in the reverse direction. A diode 19, poled for easy current flow in the direction from emitter 12 toward base 14, is connected in parallel with winding 15 to clip any negative tails from pulses passed through transformer 16. A resistor 20 is returned to ground from emitter electrode 12, and the primary winding 21 of transformer 16 is connected from ground to one of the terminals of a switch 22.

The remaining stages of the embodiment of the invention illustrated in Fig. 1 are the same as the first, with the internal collector-emitter paths of the successive transistors forming a series chain. A direct-current carry pulse source 23 is provided with its output terminals connected between collector electrode 13 of the first stage and ground, while a direct-current control pulse source 24, synchronized with carry pulse source 23, is provided with its output terminals connected between the other terminal of switch 22 and ground. The ungrounded side of control pulse source 24 is similarly connected to the switches in the base circuits of all of the remaining transistor stages, permitting a pulse from control pulse source 24 to be applied to the emitter-base circuits of the respective stages both selectively and substantially simultaneously. To isolate each stage from the next for testing purposes, a diode 25, poled for easy current flow away from emitter 12 of the first stage, may be connected between that electrode and the collector of the second stage as shown. Similar diodes may also be connected between successive ones of the succeeding stages. A load or utilization circuit 26 is returned to ground from the emitter electrode of the final stage in the chain.

Figure 2:
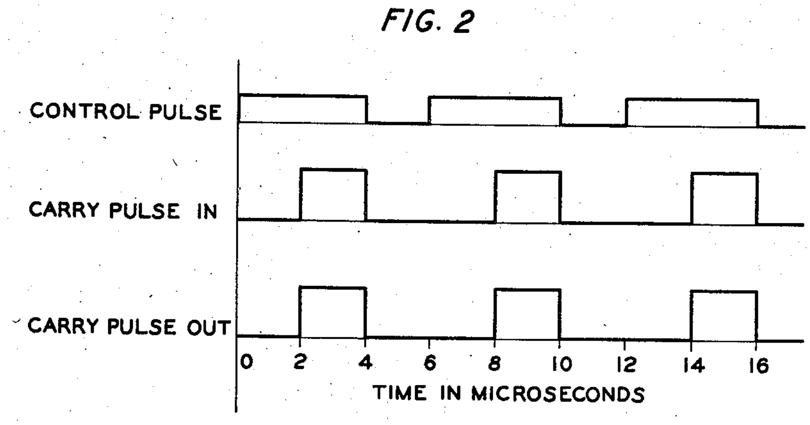
Fig. 2 illustrates the pulse timing feature of the embodiment of the invention shown in Fig. 1.

In operation, carry pulse source 23 and control pulse source 24 in the embodiment of the invention shown in Fig. 1 are synchronized in the manner illustrated in the top two waveforms in Fig. 2. The carry pulses which are to be transmitted through the fast carry chain to load circuit 26 are, for example, each two microseconds in length and occur one each six microseconds. In order to pass these carry pulses through the junction transistor chain, control pulses from source 24 are applied to each of the transistor emitter-base circuits whenever the respective control switches 22 are closed. In accordance with the present invention, each control pulse (shown in the top line of Fig. 2) leads the corresponding carry pulse by at least the turn-on time of the slowest transistor of the chain and extends in length for a sufficient time so that the entire carry pulse is permitted to pass through each transistor. By way of example, for n-p-n transistors of the 1853 type, each control pulse leads the corresponding carry pulse by approximately two microseconds and may be approximately four microseconds in length. As a result, the carry pulse overlaps the entire last half of the control pulse, insuring that each transistor is maintained in its low impedance condition until the entire carry pulse has been passed. As an alternative, however, the control pulse may be terminated short of the trailing edge of the carry pulse by a time equal to the storage time of the minimum storage time transistor. With such an arrangement, all transistors still pass the entire carry pulse without altering its shape and with substantially zero delay, as shown in the bottom line of Fig. 2.

Each junction transistor gate circuit in the embodiment of the invention shown in Fig. 1 is provided with a small reverse emitter bias by the respective direct voltage source 18 in order to avoid spurious transmission in the absence of a control pulse. When a control pulse from control pulse source 24 is applied at the transistor base, this small reverse bias is overcome and the emitter junction is biased sufficiently in the forward direction to switch internal collector-emitter path of the transistor to its low impedance condition. When, by virtue of the closing of each switch 22, the control pulse is applied to all of the transistors, the carry pulse is transmitted through the chain to load circuit 26. If, however, any switch 22 controlling the application of a control pulse to a transistor emitter-base circuit is left open, that particular gate will remain closed and transmission will be blocked.

Figure 3:
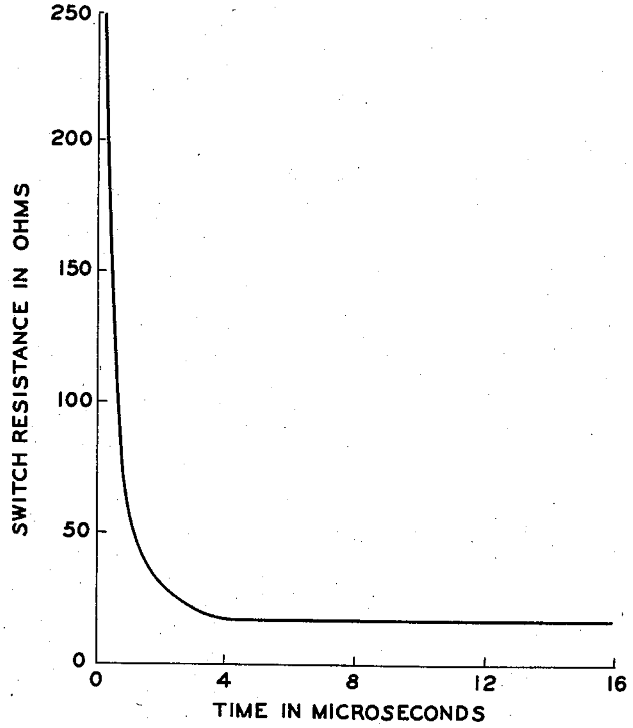
Fig. 3 is a curve showing how the internal collector-emitter impedance of a typical junction transistor changes with time after the application of a pulse of direct current biasing the emitter junction in the forward direction.

Fig. 3 illustrates the approximate manner in which the internal collector-emitter impedance of a typical n-p-n transistor of the 1853 type varies after the application of a one milliampere control pulse to its emitter-base circuit. For the indicated values, the carry pulse applied to the collector is 10 milliamaperes and the impedance is measured substantially a tenth of a microsecond after the application of the carry pulse. As shown, the switch impedance drops rapidly from a high value after the application of a control pulse and, after a soak time of the order of two microseconds, levels off at a constant value of the order of 20 ohms or less.

For a more detailed analysis of the switching behavior of junction transistors, reference is made to the article "Large Signal Behavior of Junction Transistors" by J. J. Ebers and J. L. Moll, which appeared at pages 1761 through 1772 of the December 1954 issue of the Proceedings of the I.R.E., and to the article "Large Signal Transient Response of Junction Transistors" by J. L. Moll, which appeared at pages 1773 through 1783 of the same issue of the Proceedings of the I.R.E.

Junction transistors of the p–n–p type may, it should be noted, be used in the embodiment of the invention illustrated in Fig. 1 instead of those of the n–p–n type. For transistors of the p–n–p type, however, all battery and diode polarities should be reversed, and the pulses carried by carry pulse source 23 and control pulse source 24 should be negative-going instead of positive-going.

From another point of view, the embodiment of the invention shown in Fig. 1 may be regarded not as a fast carry chain for use in a parallel binary adder but as a logical And circuit, in which the emitter electrode of the final transistor stage is the output terminal and the high side of each pulse transformer primary winding 21 is an input terminal. Carry pulse source 23 and control pulse source 24 continue to function in the manner described, although the term "carry" no longer has its former significance. Input pulses are applied to the various stages by closing the respective switch 22 and when all switches 22 are closed, a control pulse is applied to each transistor simultaneously. Under such conditions, each transistor is switched to its low impedance condition in advance of the corresponding "carry" pulse and the latter pulse is transmitted completely through the chain to provide an output pulse. If one or more of the switches 22 is left open, i. e., no input is supplied to the corresponding transistor, the "carry" pulse is blocked and no output is provided.

Figure 4:
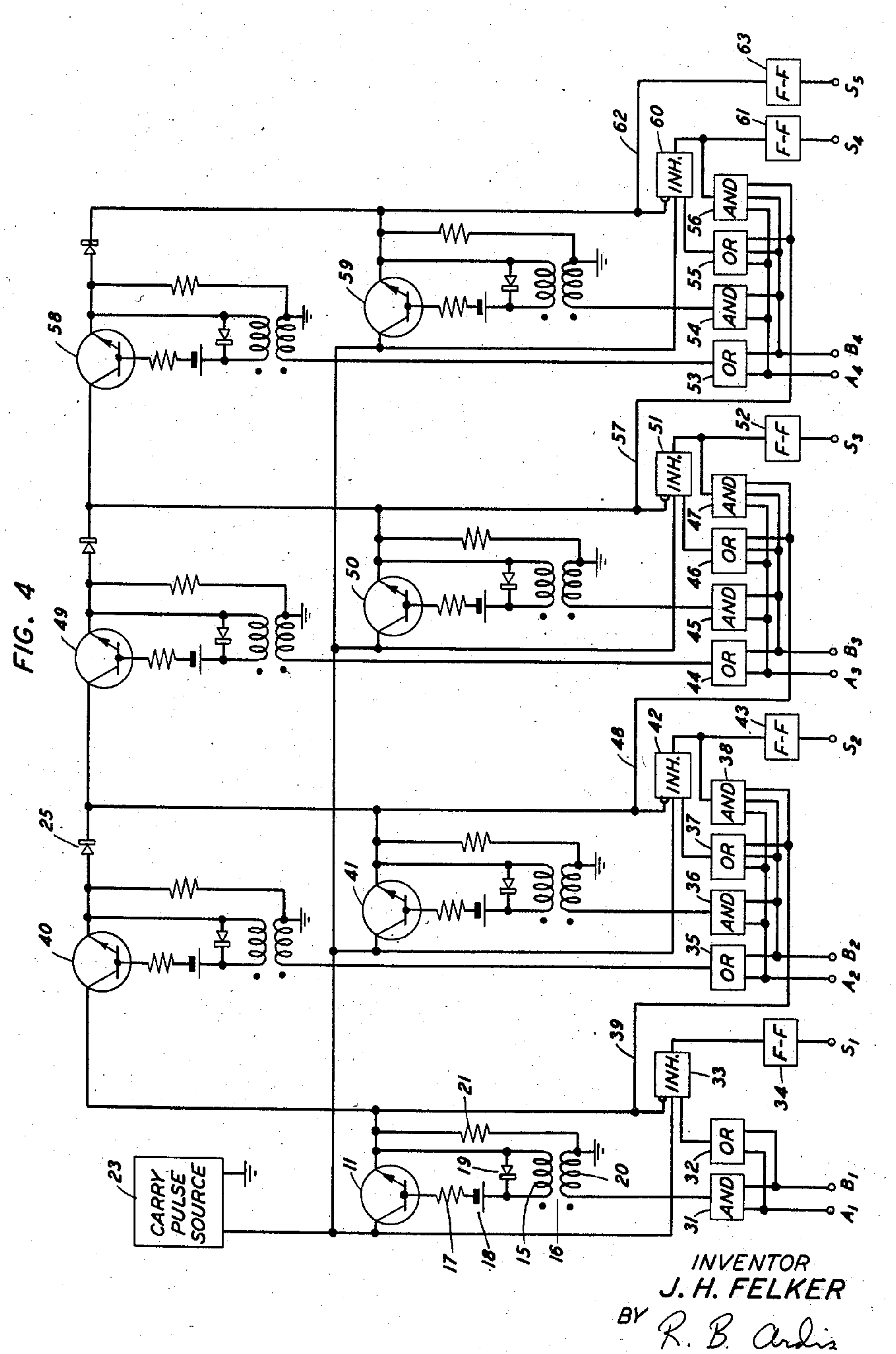
Fig. 4 illustrates a complete parallel binary adder featuring a junction transistor fast carry system embodying the present invention.

The parallel binary adder shown in partial block diagram form in Fig. 4 incorporates a junction transistor carry system embodying the present invention. By way of example, it is arranged to handle four-digit binary numbers but could be given an enlarged capacity simply by increasing the number of digit stages. Four stages, however, serve as well as a greater number of stages to illustrate the principles involved and the advantages provided by the invention.

The basic logic elements in the parallel binary adder of Fig. 4 are shown as boxes for the sake of simplicity. These include the And, Or, and INH (for inhibition) circuits and may, by way of example, be similar to those illustrated on pages 424 and 425 of the book "Principles of Transistor Circuits," edited by R. F. Shea and published in 1953 by John Wiley and Sons. Of these circuits, the Or circuit will have an output when any one of its input terminals is energized, and the And circuit will have an output only if all of its input terminals are energized. The INH or inhibition circuit, on the other hand, is an And circuit with means for preventing a signal from appearing at its output as long as there is a signal on its inhibiting input lead. In addition, a number of flip-flop circuits (F–F) are shown. These may be any standard transistor bistable or flip-flop circuits and are preferably provided with "clock" reset pulses which either restore them to or retain them in their zero current conditions at predetermined intervals (see, e.g., the present applicant's United States Patent 2,670,445, issued February 23, 1954).

The various signal input and output terminals of the parallel adder in Fig. 4 are labeled according to the following notation:

$$\begin{array}{r} A_4\ A_3\ A_2\ A_1 \\ B_4\ B_3\ B_2\ B_1 \\ \hline S_5\ S_4\ S_3\ S_2\ S_1 \end{array}$$

where the A figures represent the augend, the B figures the addend, and the S figures the sum. In this binary representation, the least significant bit is on the right in each instance, as is conventional. In the actual adder illustrated in Fig. 4, the digit stages are in the reverse order, with the stage representing the least significant bit on the left, so that the circuit operation may be described in an orderly left to right fashion.

At the lower left-hand corner of Fig. 4, the terminals $A_1$ and $B_1$ are shown connected to both an And circuit 31 and an Or circuit 32. The output of And circuit 31 is coupled to the base of a junction transistor gate 11 like those in the embodiment of the invention illustrated in Fig. 1, while the output of Or circuit 32 is connected to a non-inhibiting input of an inhibition circuit 33. A carry pulse source 23, like that in Fig. 1, has one output terminal grounded and the other connected to the collector electrode of transistor gate 11. In addition, the same output terminal of carry pulse source 23 is connected to another non-inhibiting input of inhibition circuit 33. The inhibiting input terminal of inhibition circuit 33 is connected to the emitter of gate 11, and its single output is connected through a flip-flop circuit 34 to sum terminal $S_1$, which registers the least significant bit of the sum of the added binary numbers.

The second digit stage of the parallel adder is somewhat similar to the first, but includes additional logic elements. Terminals $A_2$ and $B_2$, which receive the next least significant bits of the augend and addend, respectively, are connected to an Or circuit 35, an And circuit 36, an Or circuit 37, and an And circuit 38. In addition, a local carry lead 39 is connected between the emitter of junction transistor gate 11 and additional inputs of Or circuit 37 and And circuit 38. The output of Or circuit 35 is coupled to the base of junction transistor gate 40, while the output of And circuit 36 is coupled to the base of junction transistor gate 41. Gates 40 and 41 are substantially the same as gate 11 and have their emitter electrodes connected together to the inhibiting input lead of an inhibition circuit 42. The emitter electrode of transistor gate 11 is connected to the collector electrode of gate 40, while the high potential side of carry pulse source 23 is connected to the collector electrode of gate 41 and to a non-inhibiting input of inhibition circuit 42. The output of Or circuit 37 is connected to another non-inhibiting input of inhibition circuit 42, and the outputs of both inhibition circuit 42 and And circuit 38 are connected through a flip-flop circuit 43 to sum terminal $S_2$, which registers the next least significant bit of the sum of the added binary numbers.

The third digit stage is substantially the same as the second. Input terminals $A_3$ and $B_3$ are connected to an Or circuit 44, and And circuit 45, an Or circuit 46, and an And circuit 47. As in the preceding stage, a local carry lead 48 is connected between the emitter electrode of gate 41 and additional inputs of Or circuit 46 and And circuit 47. The output of Or circuit 44 is coupled to the base of another junction transistor gate 49, while the output of And circuit 45 is coupled to the base of a junction transistor gate 50. The collector of gate 49 is connected to the emitter of preceding gate 40 (with diode 25, for example, in between for isolation purposes), and the collector of gate 50 is connected to the high potential side of carry pulse source 23. The emitter electrodes of junction transistor gates 49 and 50 are connected together to the inhibiting input of an inhibition circuit 51, and the non-inhibiting inputs of inhibition circuit 51 are supplied respectively from Or circuit 46 and the high potential side of carry pulse source 23. The outputs of And circuit 47 and inhibition circuit 51 are connected through a flip-flop circuit 52 to sum terminal $S_3$.

The final digit stage of the parallel adder is the same as the second and third stages. Augend and addend bit input terminals $A_4$ and $B_4$ are connected to an Or circuit 53, an And circuit 54, an Or circuit 55, and an And circuit 56. A local carry lead 57 from the previous stage is connected between the emitter electrode of gate 50 and additional inputs of Or circuit 55 and And circuit 56. The outputs of Or circuit 53 and And circuit 54 are coupled to the base electrodes of junction transistor gates 58 and 59, respectively. The emitter electrode of the transistor gate 49 in the preceding stage is connected to the collector electrode of gate 58, while the high potential side of carry pulse source 23 is connected to both the collector electrode of gate 59 and a non-inhibiting input of an inhibition circuit 60. The emitter electrodes of gates 58 and 59 are connected together to the inhibiting input terminal of inhibition circuit 60, and the respective outputs of And circuit 56 and inhibition circuit 60 are connected through a flip-flop circuit 61 to sum terminal $S_4$. In addition, a final local carry lead 62 is connected from the emitter electrode of gate 59 through a flip-flop circuit 63 to the final sum terminal $S_5$.

In accordance with the present invention, the parallel binary adder which has just been described actually includes a number of the fast carry chains illustrated in Fig. 1 superimposed upon one another. One fast carry chain, for example, is made up of gates 11, 40, 49, and 58. Another comprises gates 41, 49, and 58, while still another includes gates 50 and 58. Substantially instantaneous transmission of a carry pulse when permitted by the logic circuits is, in accordance with the invention, provided by synchronizing carry pulse source 23 with the application of the augend and addend digits to the respective adder input leads. The augend and addend digits are applied simultaneously and, as illustrated in Fig. 2, are timed to have their leading edges out in front of the leading edge of the corresponding carry pulse by at least the turn-on time of the slowest junction transistor gate. When appropriate, as determined by the logic elements, each gate is thereby placed in its low impedance condition before the carry pulse comes along, and the latter is transmitted through the chain with substantially no time delay. The resulting fast carry permits all digit stages of the adder to function substantially simultaneously and the full speed advantages of the parallel type circuit to be realized, even though junction transistors are employed as the active gating elements.

The detailed functioning of the parallel binary adder embodying the present invention and illustrated in Fig. 4 may best be described by means of the following table showing the state of the output of each of the various elements in binary form. The following four numerical examples are used:

| Example 1 | Example 2 | Example 3 | Example 4 |
|---|---|---|---|
| A 0011 | A 0111 | A 0011 | A 0110 |
| B 1101 | B 1101 | B 1011 | B 1100 |
| S 10000 | S 10100 | S 1110 | S 10010 |

In the table, the indicated fast carry gate output is that at the transistor emitter electrode. Each registered output digit is underlined for ease of reference.

*Table I*

| Element | Ex. 1 | Ex. 2 | Ex. 3 | Ex. 4 |
|---|---|---|---|---|
| Carry pulse source 23 | 1 | 1 | 1 | 1 |
| Input $A_1$ | 1 | 1 | 1 | 0 |
| Input $B_1$ | 1 | 1 | 1 | 0 |
| And circuit 31 | 1 | 1 | 1 | 0 |
| Or circuit 32 | 1 | 1 | 1 | 0 |
| Fast carry gate 11 | 1 | 1 | 1 | 0 |
| INH circuit 33 | 0 | 0 | 0 | 0 |
| Output $S_1$ | 0 | 0 | 0 | 0 |
| Input $A_2$ | 1 | 1 | 1 | 1 |
| Input $B_2$ | 0 | 0 | 1 | 0 |
| Or circuit 35 | 1 | 1 | 1 | 1 |
| And circuit 36 | 0 | 0 | 1 | 0 |
| Or circuit 37 | 1 | 1 | 1 | 1 |
| And circuit 38 | 0 | 0 | 1 | 0 |
| Fast carry gate 40 | 1 | 1 | 1 | 0 |
| Fast carry gate 41 | 0 | 0 | 1 | 0 |
| INH circuit 42 | 0 | 0 | 0 | 1 |
| Output $S_2$ | 0 | 0 | 1 | 1 |
| Input $A_3$ | 0 | 1 | 0 | 1 |
| Input $B_3$ | 1 | 1 | 0 | 1 |
| Or circuit 44 | 1 | 1 | 0 | 1 |
| And circuit 45 | 0 | 1 | 0 | 1 |
| Or circuit 46 | 1 | 1 | 1 | 1 |
| And circuit 47 | 0 | 1 | 0 | 0 |
| Fast carry gate 49 | 1 | 1 | 0 | 0 |
| Fast carry gate 50 | 0 | 1 | 0 | 1 |
| INH circuit 51 | 0 | 0 | 1 | 0 |
| Output $S_3$ | 0 | 1 | 1 | 0 |
| Input $A_4$ | 0 | 0 | 0 | 0 |
| Input $B_4$ | 1 | 1 | 1 | 1 |
| Or circuit 53 | 1 | 1 | 1 | 1 |
| And circuit 54 | 0 | 0 | 0 | 0 |
| Or circuit 55 | 1 | 1 | 1 | 1 |
| And circuit 56 | 0 | 0 | 0 | 0 |
| Fast carry gate 58 | 1 | 1 | 0 | 1 |
| Fast carry gate 59 | 0 | 0 | 0 | 0 |
| INH circuit 60 | 0 | 0 | 1 | 0 |
| Output $S_4$ | 0 | 0 | 1 | 0 |
| Output $S_5$ | 1 | 1 | 0 | 1 |

The speed of operation of the illustrated adder is particularly dependent upon the present invention in Examples 1 and 2 of the above table, which represent situations in which a carry pulse is transmitted through junction transistor gates 11, 40, 49, and 58 in succession. Since the present invention permits such transmission with substantially no time delay, the addition in the corresponding digit stages of the adder is permitted to be carried on substantially simultaneously. A carry pulse is not transmitted through quite such long chains in Examples 3 and 4, because of the operation of the logic circuits, but it is still the application of the principles of the invention which permits fast operation of the adder. In Example 3, for instance, a carry pulse is transmitted through transistor gates 11 and 40 in succession, while in Example 4 it is transmitted through transistor gates 50 and 58.

It is to be understood that the above-described arrangements are illustrative of the application of the principles of the invention. Numerous other arrangements may be devised by those skilled in the art without departing from the spirit and scope of the invention.

What is claimed is:

1. A fast carry system which comprises a plurality of transistors each having an emitter electrode, a collector electrode, and a base electrode, circuit means connecting the internal transistor paths between a pair of said electrodes in tandem transmission relation to form a series chain, a source of a direct-current control pulse, circuit means to apply said control pulse to the remaining electrode of each of said transistors, each of said transistors being biased to provide a low impedance between its said pair of electrodes only in the presence of said control pulse, a source of a direct-current carry pulse synchronized with said control pulse, said carry pulse overlapping at least a portion of said control pulse in time and having its leading edge trailing the leading edge of said control pulse, circuit means to apply said carry pulse to one of said pair of electrodes of the first transistor at one end of said chain for transmission through each of said transistors in succession, and utilization means connected to the other of said pair of electrodes of the last transistor at the other end of said chain, whereby said carry pulse is transmitted from said carry pulse source through each of said transistors in succession to said utilization means with substantially no delay.

2. A fast carry system which comprises a plurality of transistors each having an emitter electrode, a collector electrode, and a base electrode, circuit means connecting the internal transistor paths between a pair of said electrodes in tandem transmission relation to form a series chain, a source of a direct-current control pulse, a pulse transformer for each of said transistors having a winding connected between one of said pair of electrodes and the remaining electrode, each of said pulse transformers also having a winding coupled to said control pulse source, the said windings of each of said transformers being poled to bias the transistor emitter electrode in the forward direction in the presence of said control pulse, a source of a direct-current carry pulse synchronized with said control pulse, said carry pulse overlapping at least a portion of said control pulse in time and having its leading edge trailing the leading edge of said control pulse, circuit means to apply said carry pulse to one of said pair of electrodes of the first transistor at one end of said chain, and utilization means connected to the other of said pair of electrodes of the last transistor at the other end of said chain, whereby said carry pulse is transmitted from said carry pulse source through each of said transistors in succession to said utilization means with substantially no delay.

3. A fast carry system which comprises a plurality of transistors each having an emitter electrode, a collector electrode, and a base electrode, circuit means connecting the internal collector-emitter paths of said transistors in tandem transmission relation to form a series chain, a source of a direct-current control pulse, circuit means to apply said control pulse between the base and emitter electrodes of each of said transistors to bias the emitter electrode in the forward direction, a source of a direct-current carry pulse synchronized with said control pulse, said carry pulse overlapping at least a portion of said control pulse in time and having its leading edge trailing the leading edge of said control pulse, circuit means to apply said carry pulse to the collector electrode of the first transistor at one end of said chain, and utilization means connected to the emitter electrode of the last transistor at the other end of said chain, whereby said carry pulse is transmitted from said carry pulse source through each of said transistors in succession to said utilization means with substantially no delay.

4. A fast carry system in accordance with claim 3 in which the leading edge of said carry pulse trails the leading edge of said control pulse by at least the turn-on time of the slowest of said transistors.

5. A fast carry system in accordance with claim 3 which includes means to bias the emitter electrode of each of said transistors in the reverse direction in the absence of a control pulse, whereby a margin is provided against spurious transmission through said chain in the absence of a control pulse.

6. A fast carry system which comprises a plurality of transistors each having an emitter electrode, a collector electrode, and a base electrode, circuit means connecting the internal collector-emitter paths of said transistors in tandem transmission relation to form a series chain, a source of a direct-current control pulse, a pulse transformer for each of said transistors having a winding connected between said base and emitter electrodes, each of said transformers also having a winding coupled to said control pulse source, the said windings of each of said transformers being poled to bias the transistor emitter electrode in the forward direction in the presence of said control pulse, a source of a direct-current carry pulse synchronized with said control pulse, said carry pulse overlapping at least a portion of said control pulse in time and having its leading edge trailing the leading edge of said control pulse, circuit means to apply said carry pulse to the collector electrode of the first transistor at one end of said chain, and utilization means connected to the emitter electrode of the last transistor at the other end of said chain, whereby said carry pulse is transmitted from said carry pulse source through each of said transistors in succession to said utilization means with substantially no delay.

7. A logical And circuit which comprises a plurality of transistors each having an emitter electrode, a collector electrode, and a base electrode, circuit means connecting the internal transistor paths between a pair of said electrodes in tandem transmission relation to form a series chain, means to apply a first pulse of direct current selectively and simultaneously to the remaining electrode of each of said transistors, each of said transistors being biased to provide a low impedance between its said pair of electrodes only in the presence of said first pulse, a source of a second pulse of direct current synchronized with said first pulse, said second pulse overlapping at least a portion of said first pulse in time and having its leading edge trailing the leading edge of said first pulse, and circuit means to apply said second pulse to one of said pair of electrodes of the first transistor at one end of said chain for transmission through each of said transistors in succession, whereby said second pulse is passed through each of said transistors in succession with substantially no delay and appears at the other of said pair of electrodes of the last transistor at the other end of said chain only if said first pulse is applied by said application means to all of said transistors in said chain.

8. A logical And circuit which comprises a plurality of transistors each having an emitter electrode, a collector electrode, and a base electrode, circuit means connecting the internal collector-emitter paths of said transistors in tandem transmission relation to form a series chain, means to apply a first pulse of direct current selectively and simultaneously between the base and emitter electrodes of each of said transistors to bias the emitter electrode in the forward direction, a source of a second pulse of direct current synchronized with said first pulse, said second pulse overlapping at least a portion of said first pulse in time and having its leading edge trailing the leading edge of said first pulse, and circuit means to apply said second pulse to the collector electrode of the first transistor at one end of said chain for transmission through each of said transistors in succession, whereby said second pulse is passed through each of said transistors in succession with substantially no delay and appears at the emitter electrode of the last transistor at the other end of said chain only if said first pulse is applied by said application means to all of said transistors in said claim.

9. A gate circuit with substantially zero time delay which comprises a transistor having an emitter electrode, a collector electrode, and a base electrode, a source of a direct-current control pulse, circuit means to apply said control pulse to said transistor between a first pair of said electrodes, said transistor being biased to provide a low impedance between a second pair of said electrodes only in the presence of said control pulse, a source of a direct-current signal pulse synchronized with said control pulse, said signal pulse overlapping at least a portion of said control pulse in time and having its leading edge trailing the leading edge of said control pulse, circuit means to apply said signal pulse to one of said second pair of electrodes for transmission through said transistor to the other of said second pair of electrodes, and output means connected to the other of said second pair of electrodes.

10. A gate circuit with substantially zero time delay which comprises a junction transistor having an emitter electrode, a collector electrode, and a base electrode, a source of a direct-current control pulse, circuit means to apply said control pulse to said transistor between said emitter and base electrodes to bias the emitter junction in the forward direction, a source of a direct-current signal pulse synchronized with said control pulse, said signal pulse overlapping at least a portion of a control pulse in time and having its leading edge trailing the leading edge of said control pulse, circuit means to apply said signal pulse to said collector electrode for transmission through said transistor to said emitter electrode, and output means connected to said emitter electrode.

11. A gate circuit in accordance with claim 10 in which the leading edge of said signal pulse trails the leading edge of said control pulse by at least the turn-on time of said transistor.

12. A gate circuit in accordance with claim 10 which includes means to bias the emitter junction of said transistor in the reverse direction in the absence of a control pulse, whereby a margin is provided against spurious transmission through an internal collector-emitter path of said transistor in the absence of a control pulse.

References Cited in the file of this patent

UNITED STATES PATENTS

| | | |
|---|---|---|
| 2,585,078 | Barney | Feb. 12, 1952 |
| 2,644,893 | Gehman | July 7, 1953 |
| 2,663,800 | Herzog | Dec. 22, 1953 |
| 2,722,649 | Immel et al. | Nov. 1, 1955 |
| 2,760,087 | Felker | Aug. 21, 1956 |